United States Patent
Esposito et al.

(10) Patent No.: US 11,199,568 B2
(45) Date of Patent: Dec. 14, 2021

(54) MILLIMETER WAVE ACTIVE LOAD PULL USING LOW FREQUENCY PHASE AND AMPLITUDE TUNING

(71) Applicant: Maury Microwave, Inc., Ontario, CA (US)

(72) Inventors: Giampiero Esposito, Pasadena, CA (US); Mauro Marchetti, Amsterdam (NL); Sathya Padmanabhan, Glendora, CA (US); Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 76 days.

(21) Appl. No.: 16/580,553

(22) Filed: Sep. 24, 2019

(65) Prior Publication Data

US 2020/0103447 A1     Apr. 2, 2020

Related U.S. Application Data

(60) Provisional application No. 62/739,003, filed on Sep. 28, 2018.

(51) Int. Cl.
  *G01R 27/32*     (2006.01)
  *G01R 31/3193*   (2006.01)
  *G01R 31/317*    (2006.01)
  *G01R 31/28*     (2006.01)

(52) U.S. Cl.
  CPC .......... *G01R 27/32* (2013.01); *G01R 31/2822* (2013.01); *G01R 31/31709* (2013.01); *G01R 31/31937* (2013.01)

(58) Field of Classification Search
  CPC .......... G01R 31/2822; G01R 31/31709; G01R 31/31937; G01R 35/00; G01R 27/28; G01R 23/20; G01R 27/32
  See application file for complete search history.

(56) References Cited

U.S. PATENT DOCUMENTS

| | | | | |
|---|---|---|---|---|
| 6,639,393 B2* | 10/2003 | Tasker | ............... | G01R 27/28 324/606 |
| 7,038,468 B2* | 5/2006 | Verspecht | .............. | G01R 27/28 324/638 |
| 8,456,175 B2* | 6/2013 | Marchetti | .............. | G01R 27/32 324/615 |

(Continued)

FOREIGN PATENT DOCUMENTS

DE    102004049421 A1    6/2006

OTHER PUBLICATIONS

Y. Takayama, "A New Load-Pull Characterization Method for Microwave Power Transistors," 1976 IEEE-MTT-S International Microwave Symposium, Cherry Hill, NJ, USA, 1976, pp. 218-220, doi: 10.1109/MWSYM.1976.1123701.

(Continued)

*Primary Examiner* — Vinh P Nguyen
(74) *Attorney, Agent, or Firm* — Larry K. Roberts

(57) ABSTRACT

A load pull system for making measurements on a DUT at millimeter wave frequencies using active tuning. The system uses phase and amplitude control of each signal at low frequency before being upconverted to the millimeter wave measurement frequencies. The measured signals at the DUT plane may be down-converted for measurement with a low frequency analyzer.

31 Claims, 6 Drawing Sheets

Block diagram of an exemplary millimeter wave load pull system with amplitude and phase control at lower frequencies

(56) References Cited

U.S. PATENT DOCUMENTS

| | | | | |
|---|---|---|---|---|
| 8,497,689 | B1* | 7/2013 | Tsironis | G01R 27/32 |
| | | | | 324/642 |
| 9,214,718 | B2* | 12/2015 | Mow | H01Q 5/328 |
| 9,459,336 | B1 | 10/2016 | Tsironis | |
| 2003/0102907 | A1 | 6/2003 | Tasker et al. | |
| 2012/0161784 | A1* | 6/2012 | Benedikt | G01R 31/2822 |
| | | | | 324/612 |

OTHER PUBLICATIONS

Roberto Quaglia et al., Frequency extension of system level characterization and predistortion set up for on-wafer microwave power amplifiers, 2014 Proceedings of the 44th European Microwave Conference, pp. 1432-1435.

Valeria, Teppati et al., A W-Band On-Wafer Active Load-Pull System Based on Down-Conversion Techniques, IEEE Transactions on Microwave Theory and Techniques, vol. 62, No. 1, Jan. 2014, pp. 148-153.

L. Galantro et al., Large Signal Characterization of Millimeter Wave Devices using Mixed Signal Active Load-Pull, Electronics Research Laboratory/DIMES, Delft University of Technology, Mekelweg, The Netherlands 82nd ARFTG Microwave Measurement Conference, IEEE, Nov. 18, 2013, pp. 1-5, Nov. 10, 2013.

Patent Cooperation Treaty PCT International Search Report, International application No. PCT/US2019/052918, Applicant Maury Microwave, Inc. 5 pages.

International Searching Authority, Patent Cooperation Treaty PCT, Written Opinion of the International Searching Authority, International application No. PCT/US2019/052918, Applicant Maury Microwave, Inc. 10 pages.

F. van Raay and G. Kompa, "Waveform Measurements—The Load-Pull Aspect," 55th ARFTG Conference Digest, Boston, MA, USA, 2000, pp. 1-8, doi: 10.1109/ARFTG.2000.327394.

Galatro, L. et al., "60 GHz mixed signal active load-pull system for millimeter wave devices characterization," 80th ARFTG Microwave Measurement Conference, San Diego, CA, 2012, pp. 1-6, doi: 10.1109/ARFTG.2012.6422434.

* cited by examiner

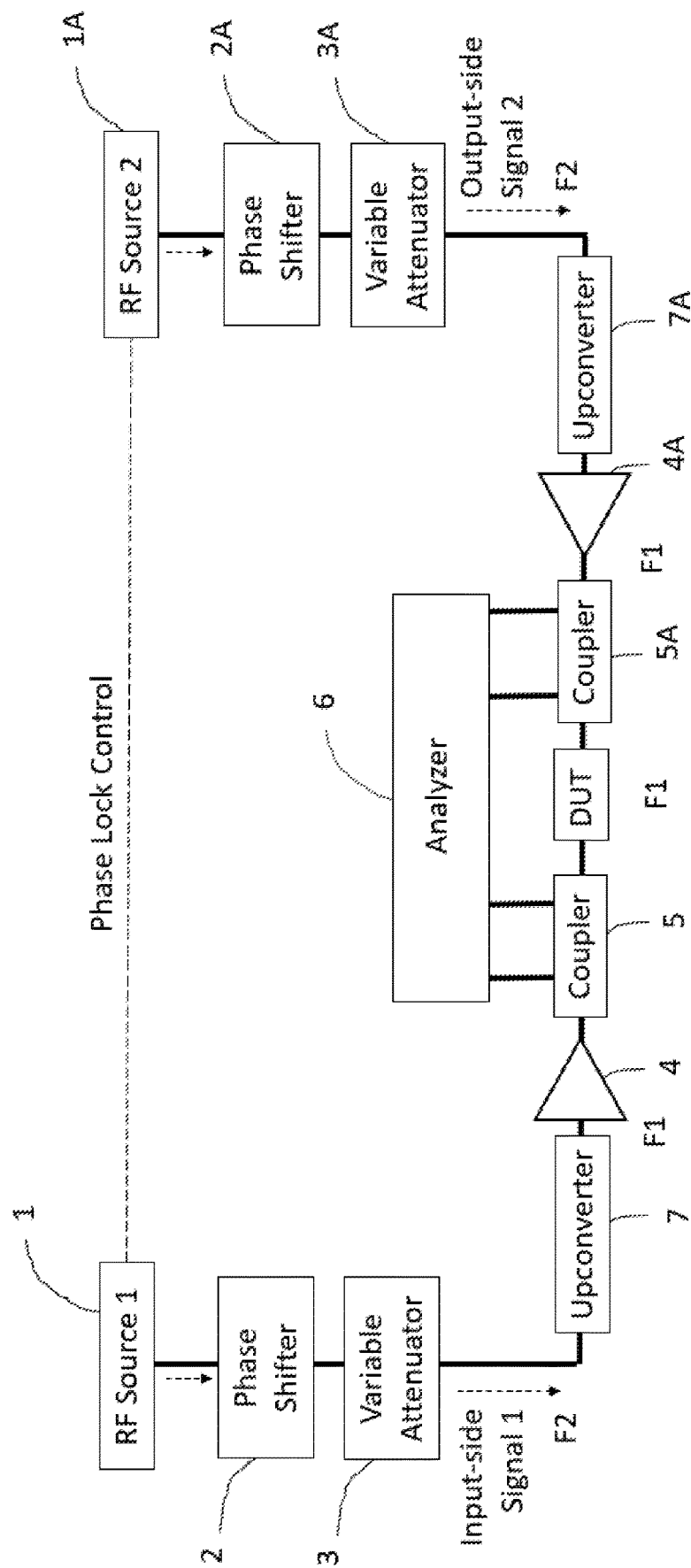
FIG. 1 Block diagram of an exemplary millimeter wave load pull system with amplitude and phase control at lower frequencies

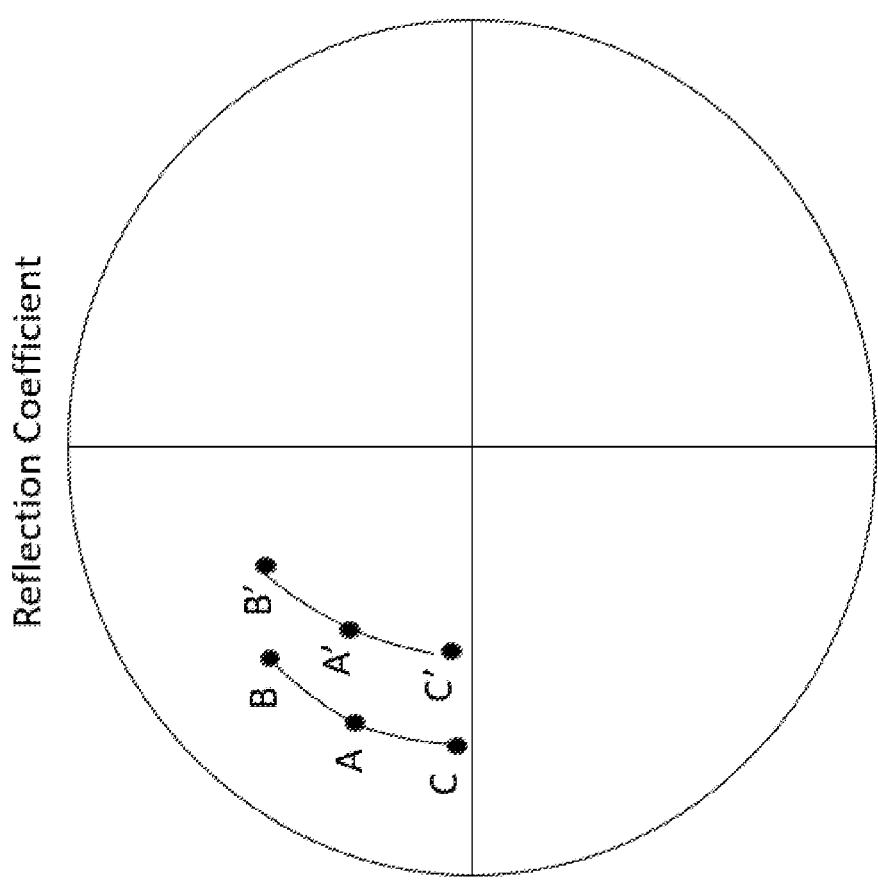
FIG. 2 Effect of jitter on reflection coefficient

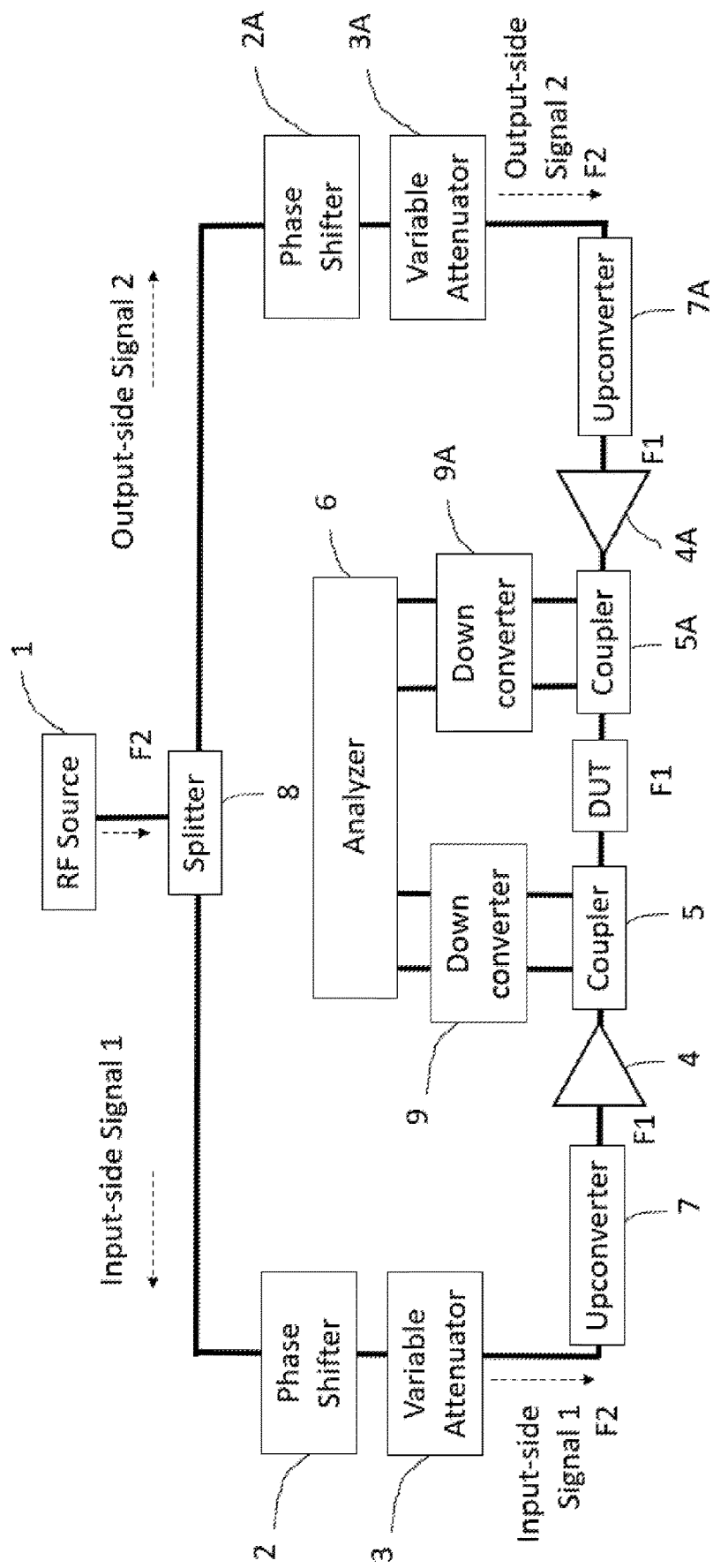
FIG. 3 Block diagram of an exemplary system using low frequency phase shifters and variable attenuators

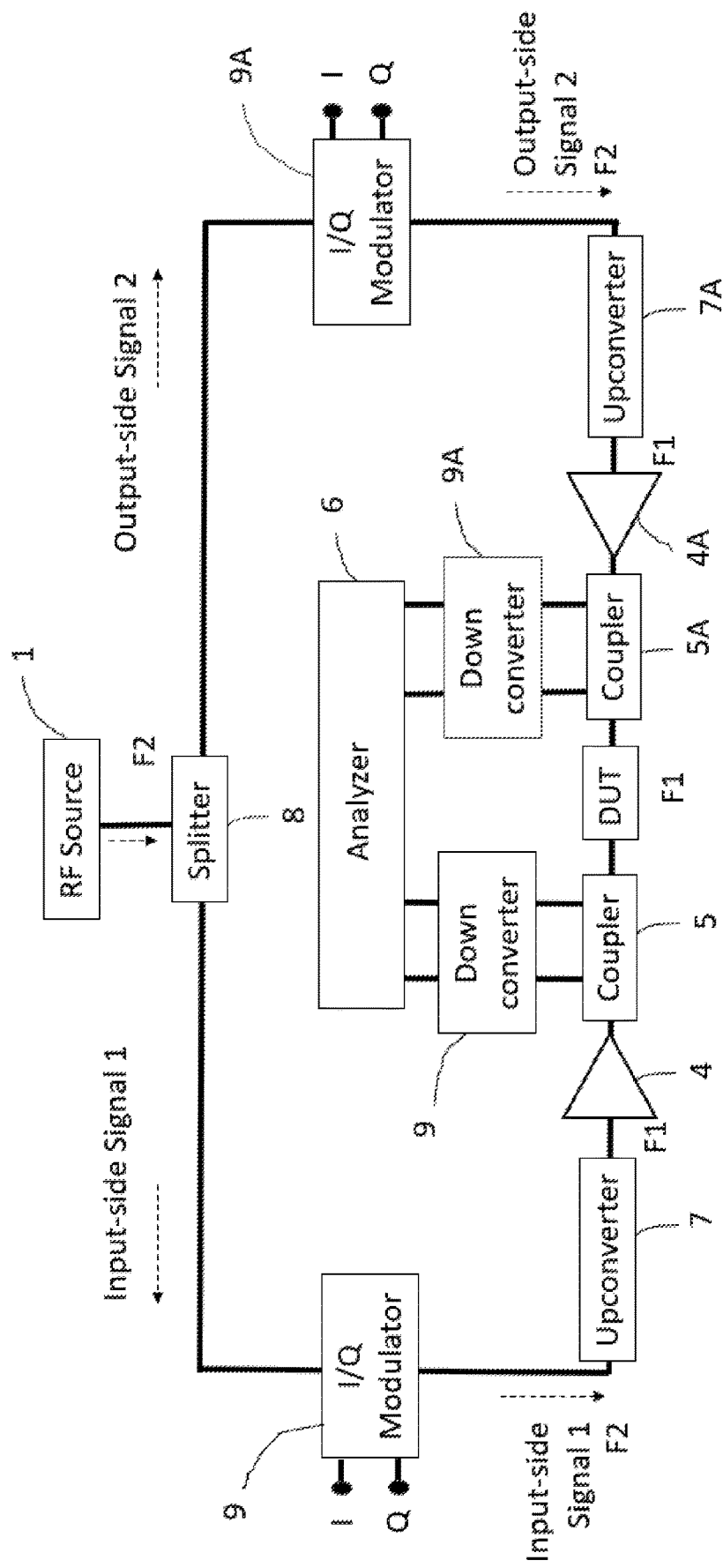
FIG. 4 Block diagram of an exemplary system using low frequency I/Q modulators

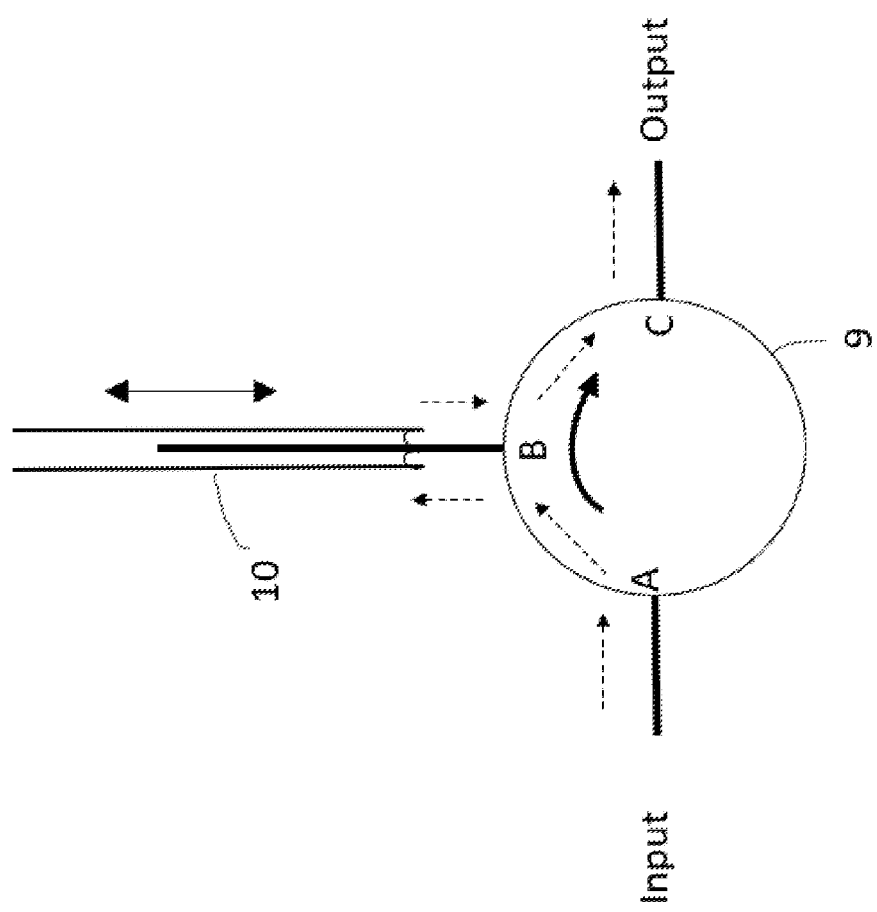
FIG. 5 Phase Shifter using a circulator and a sliding short

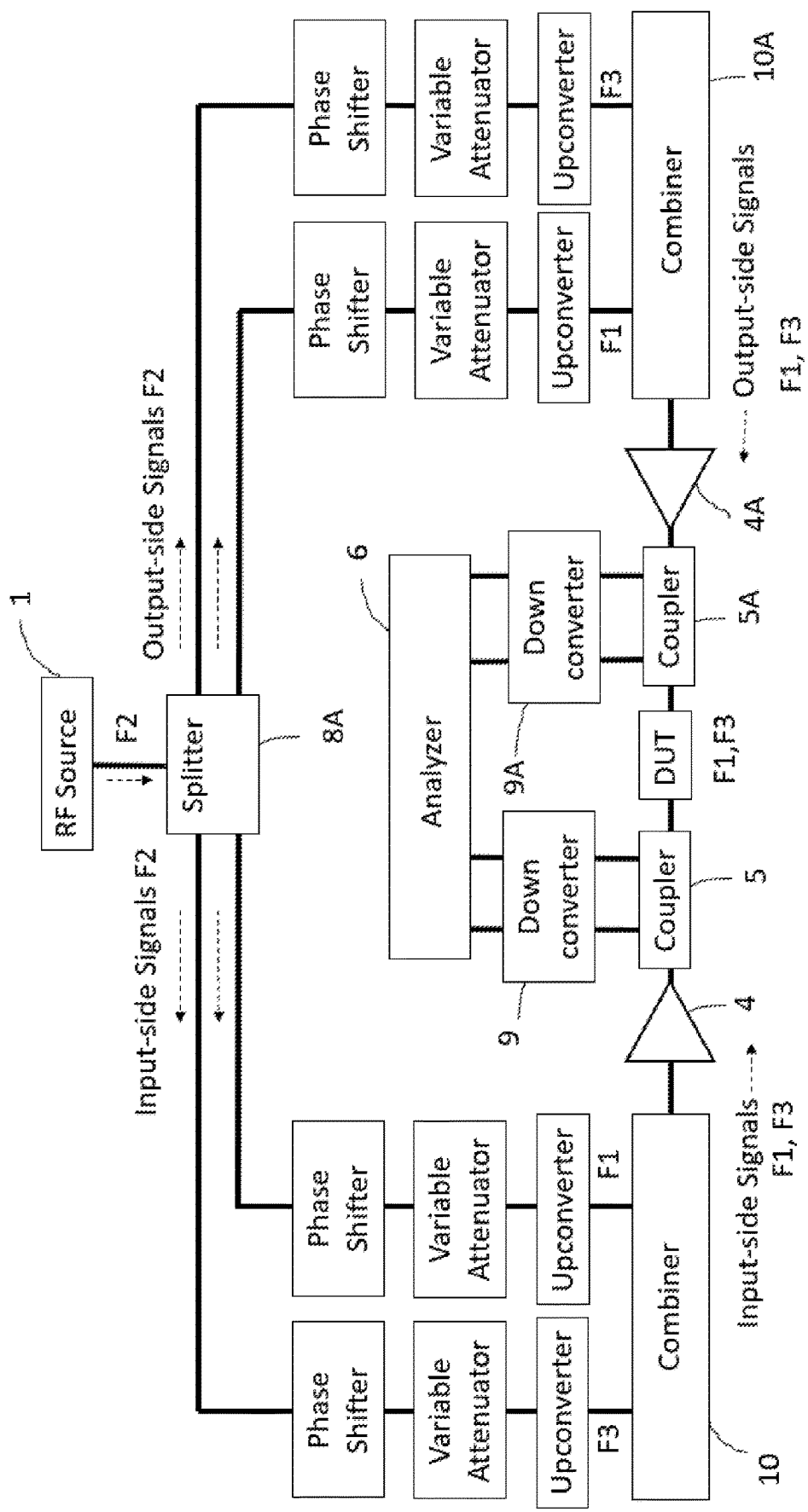
FIG. 6 Block diagram of an exemplary system with multiple injection signals at different DUT ports and different frequencies

MILLIMETER WAVE ACTIVE LOAD PULL USING LOW FREQUENCY PHASE AND AMPLITUDE TUNING

CROSS-REFERENCE TO RELATED APPLICATION

This application claims the benefit of U.S. Provisional Application No. 62/739,791 filed Sep. 28, 2018, the entire contents of which are hereby incorporated by reference.

BACKGROUND

Passive load pull systems have been widely used to characterize microwave devices. Load pull involves measuring a Device Under Test (DUT) under controlled conditions, including controlled impedances seen by the DUT. The controlled impedances may include the impedance on any port of the DUT, and they may be at the fundamental operating frequency or at a harmonic or intermodulation frequency. A typical load pull measurement would measure the DUT performance at multiple impedances to show the effect of impedance on the DUT performance. Some other conditions that may be controlled and/or varied include frequency, power level, bias values, or temperature.

In this document, impedance, reflection, reflection coefficient, or gamma are all used as general terms to describe the radio frequency (RF) termination seen at an RF port. They are functions of the signal coming out of an RF port and the signal at the same frequency coming into the port. For example, gamma is a term meaning reflection coefficient, and the reflection coefficient at the load port of the DUT at frequency f can be defined as:

$$\Gamma_L = \frac{a_2(f)}{b_2(f)}$$

Reflection coefficient is related to impedance by the expression $$Z = Z_0 \frac{(1+\Gamma)}{(1-\Gamma)}$$

where Z is the impedance and Γ is the reflection coefficient. Both terms contain the same information, so that if one is known, the other is also known. Therefore, in this document these terms will be used interchangeably. Also, the terms "RF port" and "reference plane" are used interchangeably in the context of impedance control.

In a load pull system, one RF signal is typically used to drive the input of the DUT, and the measurement instruments of the load pull system will typically measure the signals coming out of the DUT at each DUT port, including the reflected signal at the DUT input. If the DUT is non-linear, the output signals may include signals at frequencies other than that of the input drive signal, including harmonic frequencies, intermodulation frequencies, or other frequencies. In this case, the measurement instruments may be setup to measure the signals at each output frequency of interest.

A load pull system works by setting a specified impedance seen by the DUT, and then measuring signals to determine the effect of that impedance. In general, multiple impedances, at different DUT ports or different DUT output frequencies, may be set. Setting an impedance means creating a reflected signal returning to the DUT. The reflected signal will have a specific amplitude and phase relative to the output signal from the DUT.

A "passive tuner" controls the impedance at a reference plane with a passive reflection. This means that it reflects a portion of a signal coming out of a port back into that port. It controls the amplitude or phase of the reflected signal by changing RF hardware settings. The maximum reflection is limited by the physical hardware and losses between the tuner and the reference plane.

An "active tuner" controls an impedance at a reference plane by feeding (or injecting) a signal back to that reference plane with a specific amplitude and phase relative to the signal coming out of that reference plane. The amplitude and phase of the injected signal relative to the signal coming out of the DUT determines the impedance seen by the DUT. The injected signal is generated and amplified external to the DUT. Thus, the impedance seen by the DUT will be based on the "active" signal fed back to the DUT. The active tuner is said to be operating, or controlling the impedance, at the frequency of the "active" injection signal. In principle, the maximum effective reflection can be up to or even greater than unity. In practice, this is limited by the amount of power generated by the measurement system that can be fed back to the DUT to synthesize that impedance.

Active tuning load pull systems typically use two or more RF signals. In addition to the drive signal, an active load pull system works by injecting a separate signal at a DUT output frequency back into the DUT instead of passively reflecting the signal coming out of the DUT. The frequency of the injected signal is a measurement frequency, and may be any frequency where the DUT has an output. More than two signals are used if more than one frequency or more than one DUT port needs to be tuned simultaneously.

The additional signals used for active load pull have generally been created using RF signal sources which are phase locked to the RF source providing the driving signal to the DUT. This guarantees that the frequency of the two signals (the one coming out of the DUT, and the one injected back into the DUT) will be the same frequency. The phase lock loop circuit always creates some phase jitter, but this is often insignificant when the signal is phase locked at the measurement frequency.

When the measurement frequency is extended to millimeter wave frequencies, RF sources tend to be limited and expensive. Amplitude control is possible, but phase control is often not available or is very expensive.

BRIEF DESCRIPTION OF THE DRAWINGS

Features and advantages of the disclosure will readily be appreciated by persons skilled in the art from the following detailed description when read in conjunction with the drawing wherein:

FIG. 1 shows an exemplary block diagram of a load pull system for millimeter wave frequencies, wherein the amplitude and phase of each signal is controlled at the lower frequency.

FIG. 2 shows the effect of phase jitter, which is a limitation of FIG. 1.

FIG. 3 shows a block diagram of an exemplary active load pull system that eliminates phase jitter from the measurement while still using low frequency RF sources and upconverting to the desired frequencies. The amplitude and phase control at the low frequency is done with a phase shifter and a variable attenuator.

FIG. 4 shows a block diagram of another exemplary active load pull system that eliminates phase jitter from the measurement while still using low frequency RF sources and upconverting to the desired frequencies. The amplitude and phase control at the low frequency is done with an I/O modulator.

FIG. 5 shows a phase shifter using a circulator and a sliding short.

FIG. 6 shows a block diagram of an exemplary active load pull system that uses more than two signals to do active tuning at multiple DUT ports and multiple frequencies simultaneously.

DETAILED DESCRIPTION

In the following detailed description and in the several figures of the drawing, like elements are identified with like reference numerals. The figures are not to scale, and relative feature sizes may be exaggerated for illustrative purposes.

Exemplary embodiments of the invention solve the aforementioned problems by doing the amplitude and phase control at low frequencies, and then upconverting the signal to the millimeter wave measurement frequencies to do active tuning at millimeter wave frequencies. RF sources at low frequencies are much more common and economical, and both amplitude control and phase control are much simpler and more economical to implement.

Exemplary embodiments of the invention comprise a load pull system configured for tuning gamma at a millimeter wave frequency F1 using amplitude and phase control at a subfrequency F2. The subfrequency F2 is then upconverted to the frequency of interest F1 using a millimeter wave extender or multiplier or mixer. Gamma control at frequency F1 can be achieved by changing amplitude and phase of the RF signal at frequency F2 which is a lower frequency than F1.

FIG. 1 shows the block diagram of an exemplary active tuning load pull system where the amplitude and phase control is done at a low frequency F2 prior to upconversion. RF Source 1 1 produces the input-side RF signal to drive the input to the DUT. An optional input-side phase controller, in this example phase shifter 2, adjusts the phase of that drive signal, and the input-side amplitude controller, in this example variable attenuator 3, adjusts the amplitude of that drive signal. The input-side upconverter 7 then upconverts the input-side signal at frequency F2 to a much higher frequency F1. The input-side RF amplifier 4 then amplifies the signal, which then passes through the input dual directional coupler 5 and then to the input of the DUT. The coupled arms of the input dual directional coupler 5 connect to two receivers in the analyzer 6 to measure the input signal and also the reverse signal coming back from the DUT input. The output signal from the DUT passes through the output dual directional coupler 5A. The coupled arms of the output dual directional coupler 5A are connected to two more receivers in the analyzer 6 to measure the signal coming out of the DUT, and also the reverse signal coming from the output-side.

RF Source 2 1A produces the output-side injection signal, and is set to the same frequency and phase locked to RF Source 1 1. The output-side phase controller, in this example phase shifter 2A, and output-side amplitude controller, in this example variable attenuator 3A, adjusts the phase and amplitude respectively of the output-side injection signal. The output-side upconverter 7A then upconverts the output-side signal at frequency F2 to a much higher frequency F1. If the input-side and output-side upconversion ratios are the same, then the output-side upconverter 7A produces a signal at the same higher frequency F1 as the signal at the DUT input. The injection signal is then amplified by the output-side RF amplifier 4A, and then passes through the output-side dual directional coupler 5A to the DUT output.

From the DUT's point of view, the output-side injected signal acts like a reflection, to create a load impedance. The 4 channel analyzer 6 measures the incident and reflected signals from the input and output coming from both dual directional couplers. In this example, the output-side signal injected into the DUT output at frequency F1 has the same frequency as the drive signal at the DUT input for active tuning at the fundamental frequency F1 at the DUT output port.

In FIG. 1, the analyzer 6 comprises RF vector receivers that can measure both amplitude and phase of a signal. The analyzer may be a vector network analyzer (VNA), an oscilloscope, or a custom setup such as PCI chassis with vector receiver plugins, for example.

The term RF source in this document means something that generates an RF signal. It can be a stand-alone signal generator, or it could be part of a multi-source signal generator. It also can be a signal source in an instrument such as a VNA or oscilloscope. Some VNAs, for example, include multiple internal RF sources.

The RF sources in FIG. 1, 1, 1A operate at the low frequency f2, so one or both may have built-in amplitude control. In that case, one or both variable attenuators 3, 3A will not be required, replaced by the amplitude control of the respective RF source. Also, RF sources at the low frequency F2 may have built-in phase control, in which case the respective phase shifter will not be required, replaced by the phase control of the respective RF source.

If the upconverters 7, 7A have different upconvert ratios, then the upconverted output-side signal will be at a different frequency F3 than the signal at the DUT input at frequency F1. This allows active tuning at the different frequency F3, such as an intermodulation frequency or a harmonic frequency.

One limitation of the circuit in FIG. 1 is that phase jitter caused by phase locking the low frequency RF sources gets multiplied by the upconversion ratio. Multiplier ratios of 6-10 are common, and the resulting phase jitter after upconversion can be significant. A large phase jitter translates directly to a large impedance jitter. This can be a problem, since the measurement system needs to set one specific impedance at a time. An impedance that is constantly changing phase will produce poor measured data. For this reason two RF sources which are phase coherent and have very little phase jitter are preferable in this embodiment.

The phase jitter caused by FIG. 1 may be understood from FIG. 2, which displays the reflection coefficient seen by the DUT output on a polar chart. Point A is the desired impedance. Point B is the impedance if the jitter moves the phase in a clockwise direction, and point C is the impedance if the jitter moves the phase in a counter-clockwise direction. Depending on the timing of the measurement, the data will come from any impedance between points B and C. If point A' is the desired impedance for a second measurement, it is expected that the data will show the effect of moving the impedance only sideways, from point A to point A'. But, based on random timing, the first measurement might actually be recorded at point B, and the second measurement might actually be recorded at point C', so the effect is really from moving the point straight down, from point B to point C', even though the measurement records the movement from point A to A'. Thus, the load pull data could be completely wrong.

Another exemplary embodiment of this invention shown in FIG. 3 solves the phase jitter problem. Instead of two sources phase locked together, a single source produces a signal that is split by RF signal splitter 8, producing two signals at the same frequency with no relative phase jitter. An RF signal splitter is a circuit with one input and multiple outputs, where the input signal power is split between each output. FIG. 3 shows a splitter with two outputs, but a splitter could split the signal into many outputs. More signals would allow control of the impedance at more than one DUT port, or at more than one frequency.

In the exemplary embodiment of FIG. 3, each signal passes through independent phase controllers and amplitude controllers to control the amplitude and phase of each respective signal at the low frequency. Even if the one RF source 1 has the ability to control amplitude and phase, the external amplitude and phase control may still be needed for independent control on each signal. Upconverters translate the signals to the millimeter wave measurement frequency, and into the RF amplifiers and dual directional couplers. There will be no phase jitter between the DUT output signal coming from input-side signal 1 and the injection signal, coming from output-side signal 2.

If the DUT is driven with only one input signal, as in FIG. 3, the phase of the input signal becomes the reference phase for all of the other signals. Therefore, the input-side phase shifter 2 is optional in many cases.

In FIG. 3, optional down-converters 9, 9A are added between the dual directional coupler and the analyzer on both the input and output. The benefit of this is that a low frequency analyzer may be used.

In this document, millimeter wave frequencies are defined as frequencies where a suitable combination of amplitude and phase control of RF sources is unavailable, difficult to implement, or uneconomical. Generally, this might be above 50 GHz, but sometimes might apply to lower frequencies, such as down to 40 GHz.

One advantage of the embodiments of FIG. 1 and FIG. 3 is that the phase and amplitude controllers operate at the low sub-frequency F2, rather than the much higher measurement frequency F1. Components at the low sub-frequency are generally more economical and available.

Different types of upconverters may be used. An upconverter may be a multiplier, which multiplies a frequency by an integer amount. Multiplier ratios of 6-10 are common. An upconverter may be a mixer, which is used with a local oscillator (LO) to upconvert to an arbitrary frequency. An upconverter may also be a frequency extender, which is a package containing RF components needed for the upconversion. For example, in FIG. 3, a frequency extender could comprise the upconverter 7, RF amplifier 4, and the dual directional coupler 5 in one package on the input side. Alternately, a more complete frequency extender would comprise the upconverter 7, RF amplifier 4, the dual directional coupler 5, and the downconverter 9 in one package on the input side. Similar frequency extender packages could also be used on the output side.

Some DUTs may include an upconverter, so that the input frequency is a low frequency, but with a higher output frequency. In this case, the input-side upconverter is not required, and FIG. 1, FIG. 3, and FIG. 4 could be used with input-side upconverter 7 removed. The output side upconverter 7A would still be included.

In some instances, based on the operation of available hardware components, either the phase shifter or the variable attenuator may be moved to a location on the DUT side of the upconverter. One example would be when the upconverter is a multiplier that works best with a constant input power. In that case, the variable attenuator at the F2 frequency could be removed, and replaced with a millimeter wave step attenuator located after the upconverter.

An alternate method of controlling the amplitude and phase at the sub-frequency is to use an I/O modulator, as shown in FIG. 4. The signals are applied to the input of the I/O modulators 9 and 9A, and amplitude and phase of the output signal from the modulator is controlled by two DC control voltages (the I and Q inputs).

One way to make a phase shifter is shown in FIG. 5. Port B of circulator 9 is connected to sliding short 10. The signal flow from port A to port C is shown by the dashed arrows. The signal comes into port A, then travels through the circulator in the direction of the signal path within the circulator to port B. The signal then exits port B and travels to the sliding short, is reflected, and then returns to port B. The signal enters port B, then travels through the circulator in the direction of the signal path within the circulator to port C. Finally the signal exits port C. If the sliding short is moved away from port B, the signal travel length from port B to the sliding short and back gets longer, so the total phase delay increases. If the sliding short is moved toward port B, the signal travel length from port B to the sliding short and back gets shorter, so the total phase delay decreases.

FIG. 3 and FIG. 4 both show a 2-way splitter with one drive signal and one signal injected into the DUT. However, if an n-way splitter is used, more signals may be used with independent amplitude and phase control. FIG. 6 shows an exemplary block diagram using a 4-way splitter 8A with one input and four outputs. All splitter outputs are amplitude and phase controlled, and then upconverted to a desired frequency. In this example, one splitter output is the drive signal to the input side of the DUT, which is upconverted to F1. A second splitter output is also used on the input-side, upconverted to the second harmonic F3 for active tuning. The splitter outputs on the output-side are upconverted to the fundamental F1 and the second harmonic F3 of the drive frequency F1. In this example, the input-side signals are combined with an RF combiner 10 and the output-side signals are combined with an RF combiner 10A. Alternately, if the DUT had more than one output, extra signals could control the impedance at each DUT output, for example. The phase shifters and variable attenuators could be replaced with I/O modulators and any type of upconverter may be used on any signal. The amplitude and phase control may be different for each signal, and the upconverters may be different for each signal.

The block diagram of FIG. 4 could also be used to do 2-tone intermodulation measurements or modulated signal measurements. In this case the I and Q signals fed to blocks 9 and 9A are not DC voltages, but modulated signals used to create modulated signals.

The block diagram of FIG. 6 could also be used to do 2-tone intermodulation measurements instead of harmonic tuning. This measurement comprises driving the DUT with two signals (often called 2 tones) within a desired operating band. If the DUT is operating in a non-linear mode, then intermodulation will occur, producing signals within the band at intermodulation frequencies. This is a distortion of the original input signal (consisting of the two drive frequencies), so it is a useful measurement of the DUT nonlinearity. The active tuning on the output can be at the two drive frequencies, with the analyzer measuring all of the output frequencies.

Although the foregoing has been a description and illustration of specific embodiments of the subject matter, various modifications and changes thereto can be made by persons skilled in the art without departing from the scope and spirit of the invention.

What is claimed is:

1. A system for performing millimeter-wave active load pull using low frequency phase tuning on a device under test (DUT), the DUT having an input and an output, the system comprising:
   a radio-frequency (RF) source configured to generate an RF signal having a frequency F2;
   a splitter configured to split the RF signal into an F2 input-side signal and an F2 output-side signal;
   an output-side phase controller configured to perform phase control on the F2 output-side signal;
   an output-side upconverter configured to upconvert the F2 output-side signal to an F1 output-side signal having a fundamental frequency F1;
   an input-side coupler configured to couple the input-side signal into the input of the DUT;
   an input-side upconverter configured to upconvert the F2 input-side signal to an F1 input-side signal having the fundamental frequency F1;
   an output-side coupler configured to couple the F1 output-side signal into the output of the DUT;
   an analyzer configured to analyze a first signal at the input of the DUT and a second signal at the output of the DUT.

2. The system of claim 1, comprising an input-side phase controller configured to perform phase control on the F2 input-side signal.

3. The system of claim 2, wherein the input-side phase controller comprises one of a phase shifter or an IQ modulator.

4. The system of claim 1, wherein the output-side phase controller comprises one of a phase shifter or an IQ modulator.

5. The system of claim 1, wherein the output side phase controller comprises an IQ modulator, further configured to perform amplitude control on the F2 output-side signal.

6. The system of claim 1, comprising either or both:
   an input-side variable attenuator configured to perform amplitude control on the F2 input-side signal;
   an output-side variable attenuator configured to perform amplitude control on the F2 output-side signal.

7. The system of claim 1, wherein either or both of the input-side upconverter and the output-side upconverter comprises one of a frequency extender, a multiplier or a mixer.

8. The system of claim 1, wherein the analyzer is one of a vector network analyzer (VNA) or an oscilloscope.

9. The system of claim 1, wherein the upconverter and the coupler are combined into a frequency extender module of either or both of the input-side and the output-side.

10. The system of claim 1, further comprising:
    an input-side amplifier configured to amplify the input-side signal; and
    an output-side amplifier configured to amplify the F1 output-side signal.

11. The system of claim 1, further comprising:
    a first frequency downconverter configured to downconvert the first signal between the DUT and the analyzer;
    a second frequency downconverter configured to downconvert the second signal between the DUT and the analyzer.

12. The system of claim 1, wherein the frequency F1 is a millimeter-wave frequency.

13. The system of claim 1, wherein the splitter is an n-way splitter, with at least three outputs, with at least one of the splitter output signals having amplitude and phase control at the frequency F2, and wherein at least one of the splitter output signals is upconverted to a different frequency than the input side frequency F2.

14. The system of claim 1, wherein the splitter is an n-way splitter, with at least three outputs, with at least two of the splitter output signals having amplitude and phase control at the frequency F2, and wherein at least two of the splitter output signals are upconverted and used for active tuning on different DUT ports.

15. The system of claim 1, wherein the DUT includes said input-side upconverter.

16. A system for performing millimeter-wave active load pull using low frequency phase tuning on a device under test (DUT), the DUT having an input and an output, the system comprising:
    an input-side radio-frequency (RF) signal having a frequency F2;
    an output-side radio-frequency (RF) signal having a frequency F2;
    an output-side phase controller configured to perform phase control on the F2 output-side signal;
    an output-side upconverter configured to upconvert the F2 output-side signal to an F1 output-side signal having a fundamental frequency F1;
    an input-side coupler configured to couple the input-side signal into the input of the DUT;
    an input-side upconverter configured to upconvert the F2 input-side signal to an F1 input-side signal having the fundamental frequency F1;
    an output-side coupler configured to couple the F1 output-side signal into the output of the DUT; and
    an analyzer configured to analyze a first signal at the input of the DUT and a second signal at the output of the DUT.

17. The system of claim 16, comprising an input-side phase controller configured to perform phase control on the F2 input-side signal.

18. The system of claim 17, wherein the input-side phase controller comprises one of a phase shifter or an IQ modulator.

19. The system of claim 16, comprising either or both:
    an input-side amplitude controller configured to perform amplitude control on the F2 input-side signal;
    an output-side amplitude controller configured to perform amplitude control on the F2 output-side signal.

20. The system of claim 16, wherein either or both of the input-side upconverter and the output-side upconverter comprises a frequency extender, a multiplier or a mixer.

21. The system of claim 16, wherein the upconverter and the coupler are combined into a frequency extender module of either or both of the input-side and the output-side.

22. The system of claim 16, wherein the analyzer is one of a vector network analyzer (VNA) or an oscilloscope.

23. The system of claim 16, further comprising either or both:
    an input-side amplifier configured to amplify the input-side signal; and
    an output-side amplifier configured to amplify the F1 output-side signal.

24. The system of claim 16, further comprising either or both:
- a first frequency downconverter configured to downconvert the first signal between the DUT and the analyzer;
- a second frequency downconverter configured to downconvert the second signal between the DUT and the analyzer.

25. The system of claim 16, wherein the frequency F1 is a millimeter-wave frequency.

26. The system of claim 16, further comprising:
- an RF signal source configured to generate an RF signal at frequency F2;
- a splitter configured to split the RF signal from the signal source into the F2 input-side signal and the output-side RF signal.

27. The system of claim 16, further comprising:
- an input-side RF source configured to generate the input-side RF signal;
- an output-side RF source phase-locked to the input-side RF source and configured to generate the output-side RF signal.

28. The system of claim 16, wherein the output-side phase controller comprises one of a phase shifter or an IQ modulator.

29. The system of claim 16, wherein the output side phase controller comprises an IQ modulator, further configured to perform amplitude control on the F2 output-side signal.

30. The system of claim 16, wherein the DUT includes said input-side upconverter.

31. A system for performing millimeter-wave active load pull using low frequency phase and amplitude tuning on a device under test (DUT), the DUT having an input and an output, the system comprising:
- a radio-frequency (RF) source configured to generate an RF signal having a frequency F2;
- a splitter configured to split the RF signal into an F2 input-side signal and an F2 output-side signal;
- an input-side IQ modulator configured to perform amplitude control on the F2 input-side signal;
- an output-side IQ modulator configured to perform amplitude and phase control on the F2 output-side signal;
- an input-side upconverter configured to upconvert the F2 input-side signal to an F1 input-side signal having a fundamental frequency F1 that is greater than the frequency F2;
- an output-side upconverter configured to upconvert the F2 output-side signal to an F1 output-side signal having the fundamental frequency F1;
- an input-side coupler configured to couple the F1 input-side signal into the input of the DUT;
- an output-side coupler configured to couple the F1 output-side signal into the output of the DUT; and
- an analyzer configured to analyze a first signal at the input to the DUT and a second signal at the output of the DUT.

* * * * *